(12) United States Patent
Chung et al.

(10) Patent No.: US 8,654,431 B2
(45) Date of Patent: Feb. 18, 2014

(54) ACTIVE MATRIX ELECTROCHROMIC DEVICE AND METHOD OF MANUFACTURING THE SAME

(75) Inventors: Deuk-seok Chung, Yongin-si (KR); Yong-wan Jin, Seoul (KR)

(73) Assignee: Samsung Electronics Co., Ltd. (KR)

( * ) Notice: Subject to any disclaimer, the term of this patent is extended or adjusted under 35 U.S.C. 154(b) by 215 days.

(21) Appl. No.: 12/939,247

(22) Filed: Nov. 4, 2010

(65) Prior Publication Data

US 2011/0228376 A1    Sep. 22, 2011

(30) Foreign Application Priority Data

Mar. 16, 2010 (KR) ........................ 10-2010-0023400

(51) Int. Cl.
*G02F 1/15* (2006.01)
*G02F 1/153* (2006.01)

(52) U.S. Cl.
USPC ........................................ 359/265; 359/269

(58) Field of Classification Search
USPC ................................................ 359/265, 296
See application file for complete search history.

(56) References Cited

U.S. PATENT DOCUMENTS

| | | | |
|---|---|---|---|
| 4,416,517 A | 11/1983 | Beall et al. | |
| 6,870,657 B1 | 3/2005 | Fitzmaurice et al. | |
| 7,256,925 B2 | 8/2007 | Noh et al. | |
| 7,858,983 B2 * | 12/2010 | Morita et al. | 257/59 |
| 2006/0028707 A1 | 2/2006 | Shinozaki et al. | |

FOREIGN PATENT DOCUMENTS

| | | |
|---|---|---|
| JP | 2007-156148 A | 6/2007 |
| KR | 1020070070792 A | 7/2007 |
| KR | 1020080022321 A | 3/2008 |
| KR | 1020080111957 A | 12/2008 |
| WO | 9735227 A2 | 9/1997 |
| WO | 9835267 A1 | 8/1998 |

* cited by examiner

*Primary Examiner* — William Choi
(74) *Attorney, Agent, or Firm* — Cantor Colburn LLP

(57) ABSTRACT

A method of manufacturing an active matrix electrochromic device includes preparing a first substrate including a thin film transistor including a gate electrode, a source electrode, and a drain electrode, and a pixel electrode electrically connected to the drain electrode. An electrochromic layer is formed on the pixel electrode by an electrophoretic process which includes immersing the first substrate and a mesh spaced apart from each other in a solution. While the first substrate is immersed in the solution so that the pixel electrode is soaked therein, a channel of the thin film transistor is opened by applying a voltage to the gate electrode, a potential difference between the pixel electrode and the mesh is generated by connecting a voltage source between a terminal electrically connected to the source electrode and the mesh, and materials in the solution are deposited on the pixel electrode, thereby forming the electrochromic semiconductor layer.

12 Claims, 6 Drawing Sheets

ACTIVE MATRIX ELECTROCHROMIC DEVICE AND METHOD OF MANUFACTURING THE SAME

CROSS-REFERENCE TO RELATED APPLICATION

This application claims priority to Korean Patent Application No. 10-2010-0023400, filed on Mar. 16, 2010, and all the benefits accruing therefrom under 35 U.S.C. §119, the disclosure of which is incorporated herein in its entirety by reference.

BACKGROUND

1. Field

Provided are electrochromic devices and methods of manufacturing the same, and more particularly, to active matrix electrochromic devices that can be used as active matrix display devices and methods of manufacturing the same.

2. Description of the Related Art

Electrochromic devices include chromic materials of which molecular structure is chemically or physically changed when stimulated by external stimulation such as electrical stimulation, thereby generating a visible chromic effect. The operational principal of such electrochromic devices is as follows. When an electrolyte is injected between a transparent electrode (e.g., a transparent pixel electrode in active matrix devices) and an opposed electrode, a potential difference between the electrodes is generated due to external electrical stimulation. When the potential difference between the electrodes is generated due to the external electrical stimulation, ions or electrons included in the electrolyte are transferred into an electrochromic layer that undergoes an oxidation and reduction reaction, and thus, a color is visibly changed or a color shade is changed. Thus, the optical characteristics of such devices can be controlled, and may be used in information processing applications such as information recording, information displaying, and information outputting.

SUMMARY

Provided are active matrix electrochromic devices which include an electrochromic semiconductor layer selectively formed on a pixel electrode through an electrophoretic process and thus can be applied to active matrix display devices in which a pixel electrode is separated into each pixel, and methods of manufacturing the same.

Embodiments will be set forth in part in the description which follows and, in part, will be apparent from the description, or may be learned by practice of the presented embodiments.

Provided is a method of manufacturing an active matrix electrochromic device. The method includes preparing a first substrate including a thin film transistor including a gate electrode, source electrode, and a drain electrode, and a pixel electrode electrically connected to the drain electrode of the thin film transistor, immersing the first substrate and a mesh spaced apart from each other in a solution for forming an electrochromic semiconductor layer in an electrophoretic process, and while the first substrate is immersed in the solution so that the pixel electrode is soaked therein, opening a channel of the thin film transistor by applying a voltage to the gate electrode, generating a potential difference between the pixel electrode and the mesh by connecting a voltage source between a terminal electrically connected to the source electrode and the mesh, depositing materials in the solution on the pixel electrode, and thereby forming the electrochromic semiconductor layer.

The channel of the thin film transistor may be opened by connecting an external voltage source to the gate electrode.

A terminal extended from the gate electrode, to which the external voltage source is connected, may not be immersed in the solution.

The terminal electrically connected to the source electrode, to which the voltage source is connected, may not be immersed in the solution.

The first substrate may include an exposed gate terminal electrically connected to the gate electrode of the thin film transistor. The first substrate may be immersed in the solution so that the exposed gate terminal is immersed in the solution. A voltage may be generated in the solution by a voltage applied to the terminal electrically connected to the source electrode and the mesh, and the channel of the thin film transistor may be opened by automatically inducing the voltage generated in the solution to be applied the exposed gate terminal.

The solution may include a metal oxide.

Provided is an active matrix electrochromic device including a first substrate, a second substrate, a bank structure and an electrolyte layer. The first substrate includes a thin film transistor including a gate electrode, source electrode, and a drain electrode in each of a plurality of a pixel or a sub-pixel, a pixel electrode electrically connected to the drain electrode of the thin film transistor, and an electrochromic semiconductor layer on the pixel electrode. The second substrate includes an opposed electrode including a conductive material, and a reflective layer on the opposed electrode. The second substrate is combined to the first substrate so that the reflective layer faces the electrochromic semiconductor layer. The bank structure is interposed between the first substrate and the second substrate, and maintains an interval between the first substrate and the second substrate, the bank structure defining a space impregnated with an electrolyte corresponding to the electrochromic semiconductor layer. The electrolyte layer includes the electrolyte completely filled in the space defined by the bank structure.

The active matrix electrochromic device may be an active matrix display.

Provided is an active matrix electrochromic device including a first substrate including a thin film transistor including a gate electrode, a source electrode, and a drain electrode, a pixel electrode electrically connected to the drain electrode of the thin film transistor, and an electrochromic semiconductor layer formed on the pixel electrode by an electrophoretic process. The electrophoretic process includes immersing the first substrate and a mesh spaced apart from each other in a solution such that the pixel electrode is within the solution, opening a channel of the thin film transistor by applying a voltage to the gate electrode of the thin film transistor, generating a potential difference between the pixel electrode and the mesh by connecting a first voltage source between a terminal electrically connected to the source electrode, and the mesh, and depositing materials from the solution onto the pixel electrode to thereby form the electrochromic semiconductor layer.

In embodiments of the active matrix electrochromic device above and the method of manufacturing the same, the electrochromic semiconductor layer may be selectively deposited on the pixel electrode without breakdown of the active matrix device or the pixel electrode, and a deposition process may be accomplished without mixing organic materials. Thus, electrochromic characteristics may be obtained without plasticizing at high temperature. Also, a selective deposition may be available in a pixel separator for preventing cross-talk of the electrochromic device, for example, an electrochromic display, so that the active matrix electrochromic device, for example, an active matrix electrochromic display, having high resolution may be manufactured.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
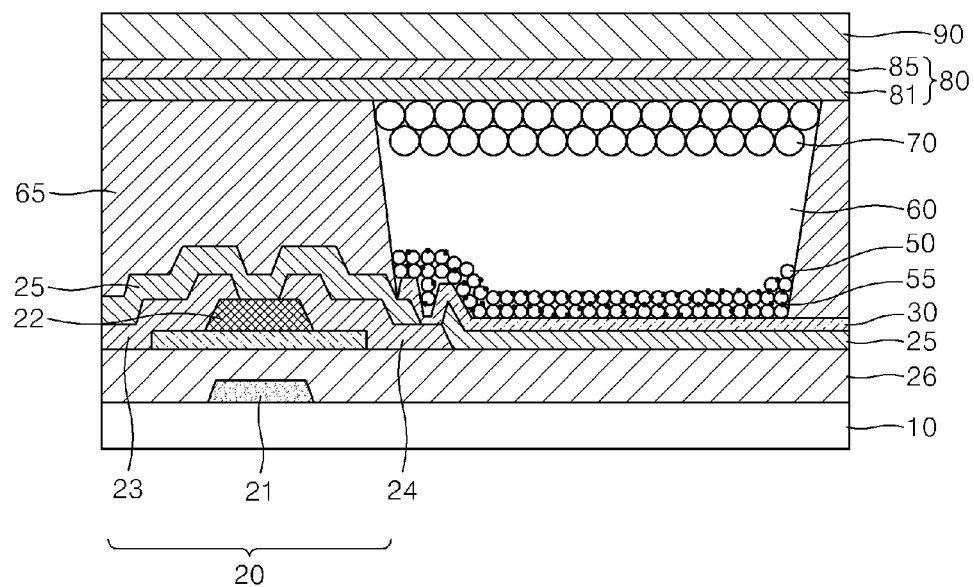
FIG. 1 is a cross-sectional diagram of an embodiment of an active matrix electrochromic device, formed by using an embodiment of a method of manufacturing an electrochromic device, according to the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or directly connected to another element or layer or intervening elements or layers. In contrast, when an element is referred to as being "directly on" or "directly connected to" another element or layer, there are no intervening elements or layers present. As used herein, the term "connected" may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

In order to manufacture an active matrix electrochromic device which includes thin film transistors in each of a plurality of a pixel area and which may be actively driven, an insulating film pattern for liquid type electrolyte impregnation is formed around each pixel area, and an electrochromic semiconductor layer is selectively formed in the insulating film pattern to be disposed on at least part of a pixel electrode, such as by an electrophoretic method.

In a general method of patterning and forming an electrochromic semiconductor layer on an electrode or a passive matrix device by using an electrophoretic method, patterning is performed by applying a voltage between a mesh electrode for applying voltage, and an electrode of a passive matrix device. However, in an active matrix device, a pixel electrode on which an electrochromic semiconductor layer is to be formed is separated into a plurality of a cell so that a voltage may not be directly applied into each cell, and a common electrode may not be drawn in an electrophoretic process.

In an embodiment of a method of manufacturing an electrochromic device, according to the present invention, a specific voltage is applied to a data electrode connected to each pixel electrode through thin film transistors, and a gate electrode for controlling a current flow, respectively. With the application of the specific voltage, an electrochromic semiconductor layer may be selectively formed on each pixel electrode by using an electrophoretic method, or an electrochromic semiconductor layer may be stably deposited on the pixel electrode, while preventing an excessive current from flowing in the thin film transistors, such as by using a self-induced voltage generated from a solution instead of external power.

FIG. 1 is a cross-sectional diagram of an embodiment of an active matrix electrochromic device formed by using an embodiment of a method of manufacturing an electrochromic device, according to the present invention.

Referring to FIG. 1, the active matrix electrochromic device includes first and second substrates 10 and 90 separated from each other by a predetermined interval, and an electrolyte layer 60 interposed between the first substrate 10 and the second substrate 90. The active matrix electrochromic device includes a plurality of a unit pixel.

A thin film transistor 20 is disposed on the first substrate 10, and a protection layer 25 is disposed to cover (e.g., overlap) substantially an entire of the first substrate 10 including the thin film transistor 20. The thin film transistor 20 includes a semiconductor layer (active layer) 22, a gate electrode 21, and source and drain electrodes 23 and 24.

A contact hole which exposes the drain electrode 24 of the thin film transistor 20, is extended completely through a thickness of the protection layer 25, and a pixel electrode 30 is electrically connected to and contacts the drain electrode 24 through the contact hole. The pixel electrode 30 is an island shape on the protection layer 25 in each of the unit pixels. Also, an electrochromic semiconductor layer 50 is disposed directly on the pixel electrode 30, to be electrically connected to and contacting the pixel electrode 30.

A bank structure 65 is disposed directly on and contacting a portion of an upper surface of the protection layer 25 and the pixel electrode 30. The bank structure 65 defines a space impregnated with the electrolyte layer 60 corresponding to the electrochromic semiconductor layer 50, and maintains an interval between the first substrate 10 and the second substrate 90. As used herein, "corresponding" indicates being the same or aligned in quantity, shape, size or positional placement relative to another element.

An electrolyte material is completely filled in the space of the bank structure 65, thereby forming the electrolyte layer 60. In an embodiment of manufacturing an electrochromic device, the bank structure 65 may be formed at substantially a same time when the protection layer 25 and the pixel electrode 30 are formed, or the bank structure 65 may be formed at substantially a same time when the protection layer 25, the pixel electrode 30, and the electrochromic semiconductor layer 50 are formed.

An opposed electrode 80 including a conductive material is disposed on an inner surface of the second substrate 90, and a reflective layer 70 is disposed directly on an inner surface of the opposed electrode 80.

The pixel electrode 30 may be transparent electrode. The opposed electrode 80 may include, for example, an indium tin oxide ("ITO") electrode layer 85 directly on the second substrate 90, and an antimony doped tin oxide ("ATO") electrode layer 81 directly on the ITO electrode layer 85 opposing the second substrate 90. The reflective layer 70 may be directly on the inner surface of the ATO electrode layer 81.

As described above, the first substrate 10 and the second substrate 90 are combined to each other while maintaining the interval therebetween by the bank structure 65. The space defined by the bank structure 65, the opposed electrode 80 and the pixel electrode 30 between the first substrate 10 and the second substrate 90 is completely filled with the electrolyte material, thereby forming the electrolyte layer 60. The electrolyte material may also be disposed between discrete portions of the reflective layer 70 and/or the electrochromic semiconductor layer 50, thereby forming a portion of the electrolyte layer 60.

The first substrate 10 may be a transparent substrate. In one embodiment, for example, the first substrate 10 may be a flexible transparent plastic substrate including a polymer material such as polyethylene terephthalate ("PET"), polyethylene naphathalate ("PEN"), polycarbonate, polystyrenes, polyacryls, or polyether sulfone ("PES"). The second substrate 90 includes the same material as or a different material from that of the first substrate 10. In one embodiment, for example, the second substrate 90 may include an opaque material. Also, at least one of the first substrate 10 and the second substrate 90 may include transparent glass.

The pixel electrode 30 may include a transparent conductive material, for example, a transparent conductive polymer material such as indium tin oxide ("ITO"), fluorine doped tin oxide ("FTO"), $ZnO-Ga_2O_3$, $ZnO-Al_2O_3$, $SnO_2-Sb_2O_3$, or polythiophenes.

In an embodiment of manufacturing an electrochromic device, the electrochromic semiconductor layer 50 is deposited on the pixel electrode 30 by an electrophoretic process. A metal oxide used to deposit the electrochromic semiconductor layer 50 may include at least one selected from the group consisting of a titanium-based oxide, a zirconium-based oxide, a strontium-based oxide, a niobium-based oxide, a hafnium-based oxide, an indium-based oxide, a tin-based oxide, and a zinc-based oxide. Only one, or at least two of these oxides may be mixed and used. In one embodiment, for example, a titanium-based oxide ($TiO_2$) may be used. An efficiency of the electrochromic semiconductor layer 50 is improved as sizes of metal oxide particles are small and porosity is high. The sizes of metal oxide particles in the electrochromic semiconductor layer 50 may be in the range of about 5 nanometers (nm) to about 30 nanometers (nm).

Electrochromic materials 55 are adsorbed to the electrochromic semiconductor layer 50. In FIG. 1, the electrochromic materials 55 are indicated as discrete darker points on discrete portions of the electrochromic semiconductor layer 50. The electrochromic materials 55, for example, n-type electrochromic materials, are adsorbed to a surface of the electrochromic semiconductor layer 50 and receive electrons transferred from the electrochromic semiconductor layer 50, thereby causing a change of a molecular structure in the electrochromic semiconductor layer 50. Thus, chromic efficiency appears.

In one embodiment, when the potential difference between the pixel electrode 30 and the opposed electrode 80 is generated due to an external electrical stimulation, electrons transferred from the electrochromic semiconductor layer 50 are received by electrochromic materials 55 adsorbed to the surface of the electrochromic semiconductor layer 50, and the electrochromic semiconductor layer 50 undergoes a change in molecular structure, such as an oxidation and reduction reaction, and thus, a color is visibly changed or a color shade is changed.

Any of a number of electrochromic materials that are commonly used in the field of electrochromic devices may be used as the electrochromic materials 55. In one embodiment, for example, a viologen compound may be mostly used. Such a compound is disclosed in International Publication WO 98/035267 and U.S. Pat. No. 6,870,657. Also, International Publication WO 97/035227 discloses a nano-electrochromic displays in which electrical active materials such as viologen are adsorbed to a nano-crystalline semiconductor material to form an electrochromic device.

The opposed electrode 80 is disposed to face the pixel electrode 30. The opposed electrode 80 may include any of a number of conductive materials suitable for the purpose described herein, and may further include a conductive material for improving a work function thereof. In one embodiment, for example, as mentioned above, the opposed electrode 80 may include the ITO electrode layer 85 directly on the second substrate 90 and the ATO electrode layer 81 directly on the ITO electrode layer 85. Also, the opposed electrode 80 may include an insulating material, when a surface of the opposed electrode 80 including the insulating material facing a transparent electrode includes a conductive material. Also, the opposed electrode 80 may include a material that is electrochemically stable, for example, platinum, gold, or carbon.

Oxidation-reduction materials or p-type electrochromic materials, such as included in the opposed electrode 80, may be adsorbed to the opposed electrode 80. The oxidation-reduction materials are oxidized to maintain an electrically neutral state when the n-type electrochromic materials on the pixel electrode 30 are reduced. Such p-type electrochromic materials may be contained in only the electrolyte of the electrolyte layer 60, or may be included in both the electrolyte and the opposed electrode 80.

In order for the p-type electrochromic materials or the oxidation-reduction materials to be well adsorbed to the opposed electrode 80, an increase in a surface area of a side of the opposed electrode 80 facing the pixel electrode 30 is required. The increase in surface area may be accomplished by using a fine structure. In one embodiment, at least one selected from the group consisting of a nano-crystalline titanium oxide, a zirconium oxide, a strontium-based oxide, a niobium-based oxide, a hafnium-based oxide, an indium-based oxide, a tin-based oxide, and a zinc-based oxide may be used. Also, only one or at least two of these oxides may be mixed and used. Arsenic (As) or fluorine (F) may be doped with these oxides. In one embodiment, for example, a nano-crystalline titanium oxide ($TiO_2$), or As doped $SnO_2$ may be used. An efficiency of the fine structure is improved as sizes of metal oxide particles are small and porosity is high. The sizes of metal oxide particles may be in the range of about 5 nm to about 30 nm.

The oxidation-reduction materials or p-type electrochromic materials used in the opposed electrode 80 may include Prussian blue, a ferrocene compound derivative, a phenithiajine compound derivative, or a compound disclosed in International Publication WO 98/035267 and U.S. Pat. No. 6,870, 657.

Also, where the reflective layer 70 is disposed on the inner surface of the opposed electrode 80, light penetrating and passing through the pixel electrode 30 is scattered to improve contrast of the electrochromic semiconductor layer 50. The reflective layer 70 may include, but is not limited to, at least one metal oxide selected from the group consisting of a titanium-based oxide, a zirconium-based oxide, a strontium-based oxide, a niobium-based oxide, a hafnium-based oxide, an indium-based oxide, a tin-based oxide, and a zinc-based oxide. Only one or at least two of these oxides may be mixed and used. Also, sizes of metal oxide particles in the reflective layer 70 may be, for example, in the range of about 100 nm to about 500 nm. In one embodiment, for example, the reflective layer 70 may include a same metal oxide as that included in the electrochromic semiconductor layer 50. A size of metal oxide particles in the metal oxide layer of the reflective layer 70, is larger than a size of the metal oxide particles in the metal oxide layer of the electrochromic semiconductor layer 50.

The electrolyte material of the electrolyte layer 60 may be a liquid type, a molten salt type, or a solid type. The electrolyte may include at least one electrochemically inactive salt, for example, a solvent of propylene carbonate, ethylene carbonate, diethyl carbonate, ethyl methyl carbonate, methyl propyl carbonate, butylene carbonate, benzonitrile, acetonitrile, tetrahydrofuran, 2-methyltetrahydrofuran, γ-butyrolactone, dioxolan, 4-methyldioxolan, N,N-dimethyl formamide, dimethylacetamide, dimethylsulfoxide, dioxane, 1,2-dimethoxy ethane, sulfolane, dichloroethane, chlorobenzene, nitrobenzene, dimethyl carbonate, methyl ethyl carbonate, diethyl carbonate, methyl propyl carbonate, methyl isopropyl carbonate, ethyl propyl carbonate, dipropyl carbonate, dibutyl carbonate, diethylene glycol, or dimethyl ether, imidazolium-based molten salt such as trialkyl imidazolium, or a resultant obtained by dissolving at mixtures of least one electrolyte formed of lithium salt such as $LiPF_6$, $LiBF_4$, $LiSbF_6$, $LiAsF_6$, $LiClO_4$, $LiCF_3SO_3$, $Li(CF_3SO_2)_2N$, $LiC_4F_9SO_3$, $LiSbF_6$, $LiAlO_4$, $LiAlCl_4$, $LiN(CxF_2x+1SO_2)(CyF_2y+1SO_2)$ (x and y are natural numbers), LiCl, or LiI in mixtures of the solvent and the imidazolium-based molten salt. The concentration of the inactive salt such as lithium salt in the electrolyte may be in the range of about 0.01 mole per liter (mol/L, or M) to about 1.0 mole per liter (mol/L, or M), for example, about 0.05 M to about 0.2 M. Also, the concentration of a ferrocene-based compound or a phenithiajine-based compound as the oxidation-reduction material in the electrolyte may be in the range of about 0.01 M to about 2 M.

An embodiment of a method of manufacturing the active matrix electrochromic device described above, is as follows.

The thin film transistor 20 is formed on the first substrate 10.

To form the thin film transistor 20, a metal layer is formed to cover the first substrate 10 and is selectively patterned through photolithography or etching, thereby forming the gate electrode 21. Then, a gate insulating film 26 is formed on the first substrate 10 including the gate electrode 21 by using an insulating material such as silicon oxide (SiOx) or silicon nitride (SiNx). Next, a semiconductor material such as intrinsic amorphous silicon is deposited on the gate insulating film 26 and is selectively patterned through photolithography or etching. Then, a doping process is performed to form the semiconductor layer (active layer) 22, and the source and drain electrodes 23 and 24 on the gate insulating film 26 on the gate electrode 21. In the illustrated embodiment, a channel area of the semiconductor layer 22 of the thin film transistor may be exposed.

Then, the protection layer 25 is formed on the first substrate 10 including the source and drain electrodes 23 and 24, by coating a thick layer formed of an organic insulating material, for example, benzocyclobutene ("BCB") or photo acryl.

Next, a photoresist is coated on the protection layer 25 to form a photoresist layer ("PR"). The PR layer on the first substrate 10 is exposed through a mask disposed on the first substrate 10 and the PR layer is developed, thereby exposing a part of the drain electrode 24. Accordingly, the contact hole through which the drain electrode 24 is exposed is formed on the protection layer 25.

Then, a transparent conductive film is formed on the first substrate 10 and is patterned through photolithography or etching, thereby forming the pixel electrode 30 in the island shape in each pixel. The pixel electrode 30 is connected from one side of the thin film transistor 20 to the drain electrode 24. In the cross-sectional diagram of FIG. 1, one pixel or sub-pixel may collectively include an area in which the thin film transistor 20 is formed and an area in which the pixel electrode 30 is formed. The pixel electrode 30 is connected to the drain electrode 24 of the thin film transistor 20.

The embodiment of the electrochromic device can be used as an active matrix display device, according to the present invention. The electrochromic device includes a two-dimensional ("2D") array of a thin film transistor 20 and pixel electrode 30 collective group, and may also include a data electrode (not illustrated) and the gate electrode 21 for actively driving a 2D pixel. An arrangement of the thin film transistor 20, the pixel electrode 30, the data electrode, and the gate electrode 21 in the active matrix display device is well known in the art of the present invention.

After the pixel electrode 30 is formed, the electrochromic semiconductor layer 50 is formed on the pixel electrode 30, by an electrophoretic method. A process of forming the electrochromic semiconductor layer 50 is described later. The electrochromic semiconductor layer 50 may be formed at substantially a same time when the bank structure 65 is formed on the first substrate 10. Alternatively, the bank structure 65 may be formed after the electrochromic semiconductor layer 50 is formed, or may be formed on the second substrate 90. The bank structure 65 may be formed on an area including the thin film transistor 20 so that a space may exist overlapping at least a portion of the pixel electrode 30.

The second substrate 90 including the opposed electrode 80 and the reflective layer 70 on one side thereof is prepared.

When the first substrate 10 and the second substrate 90 are combined with each other, an electrolyte material is injected between the first substrate 10 and the second substrate 90 in the space formed by the bank structure 65, and thus the electrolyte layer 60 is formed. Therefore, manufacture of the electrochromic device according to an embodiment of the present invention is completed.

Hereinafter, an embodiment of a process of forming the electrochromic semiconductor layer 50 on the pixel electrode 30 is described.

Figure 2:
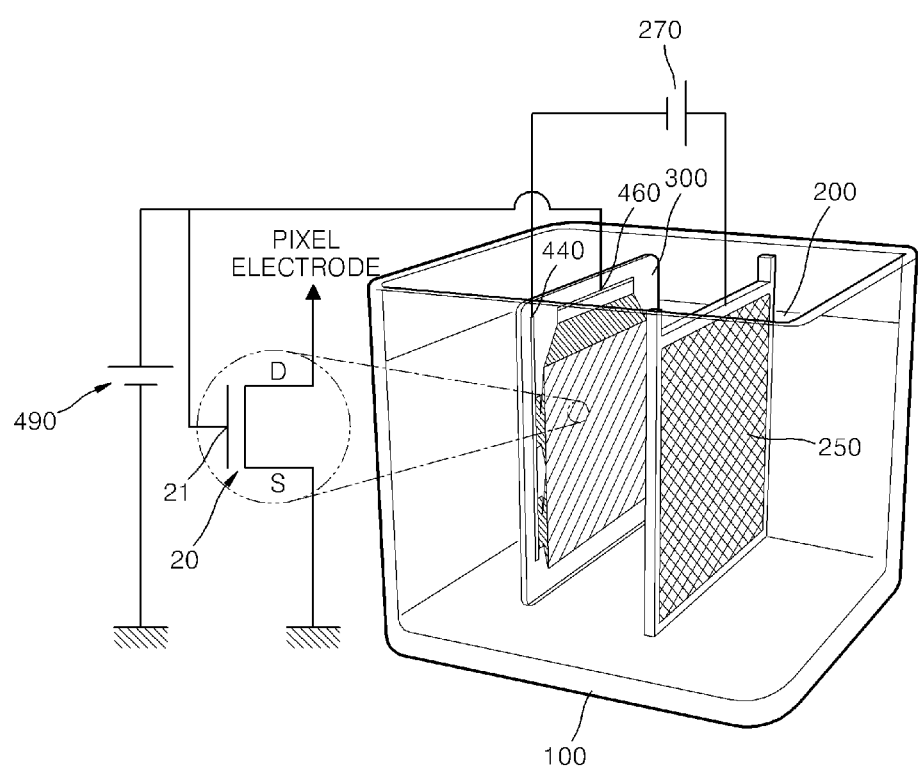
FIG. 2 illustrates an embodiment of an electrophoretic process for forming an active matrix electrochromic device, which uses an external voltage source, according to the present invention.
Figure 3:
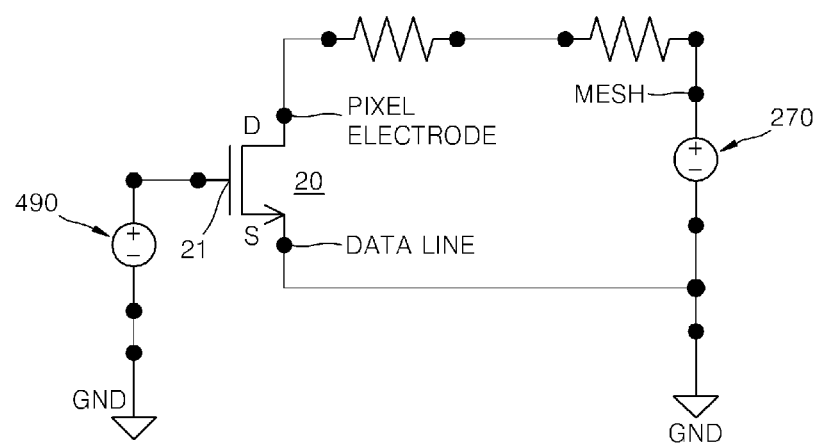
FIG. 3 schematically illustrates an embodiment of an equivalent circuit of FIG. 2.
Figure 4:
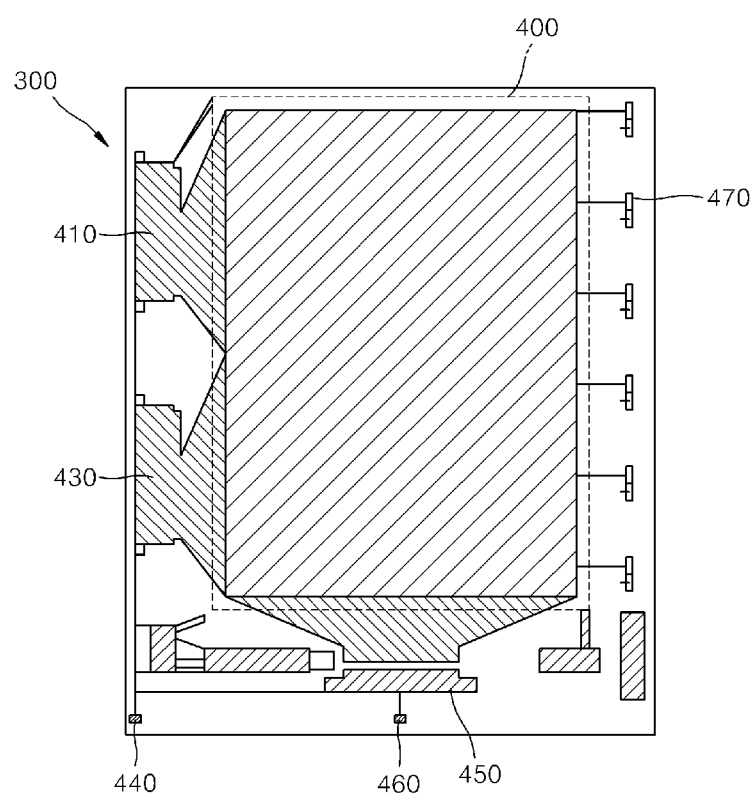
FIG. 4 schematically illustrates an embodiment of a pad pattern of a substrate of FIG. 2.
Figure 5:
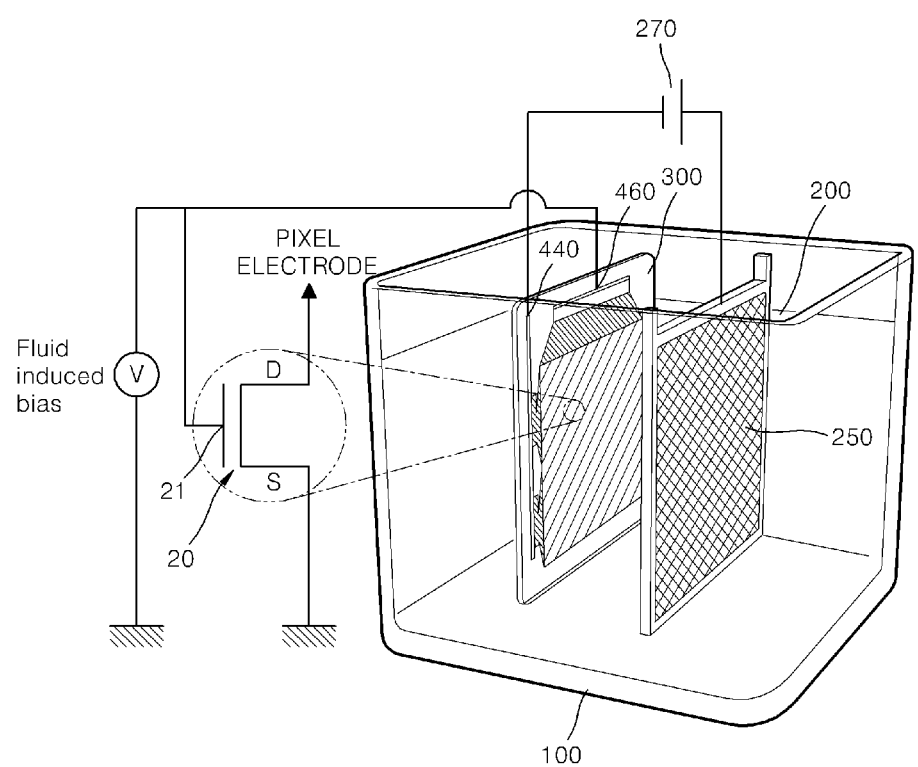
FIG. 5 illustrates another embodiment of an electrophoretic process for forming an active matrix electrochromic device, which uses a magnetic-induced voltage, according to the present invention.
Figure 6:
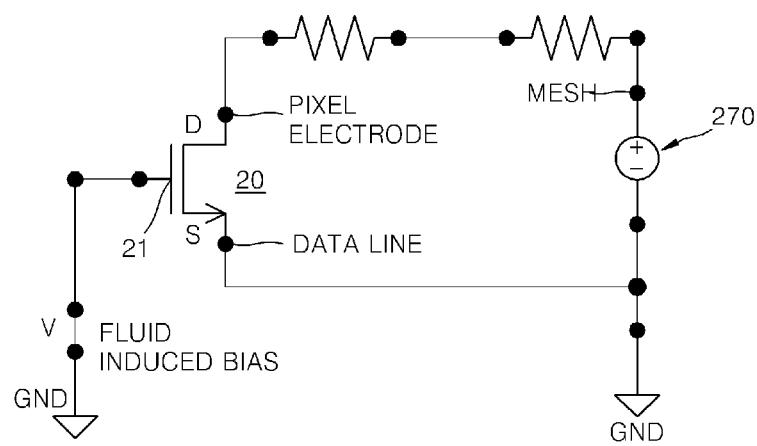
FIG. 6 schematically illustrates an embodiment of an equivalent circuit of FIG. 5.

FIG. 2 illustrates an embodiment of an electrophoretic process for forming an active matrix electrochromic device, which uses an external voltage source, according to the present invention. FIG. 3 schematically illustrates an embodiment of an equivalent circuit of FIG. 2. FIG. 4 schematically illustrates an embodiment of a pad pattern of a substrate 300 of FIG. 2. FIG. 5 illustrates another embodiment of an electrophoretic process for forming an active matrix electrochromic device, which uses a self-induced voltage, according to the present invention. FIG. 6 schematically illustrates an embodiment of an equivalent circuit of FIG. 5.

A solution 200 used in the process of forming the electrochromic semiconductor layer 50 by using the electrophoretic method, where the electrochromic semiconductor layer 50 is formed on the pixel electrode 30 of the active matrix electrochromic device including the thin film transistor 20, may include, but is not limited to, a non-polar solvent, powder of a material to be deposited, a charger, a stabilizer, and a conductor.

In one embodiment, for example, the solution 200 is prepared by dispersing oxide nanopowder in a non-polar solvent using ultrasonic waves to prepare a dispersed solution, and mixing a metal-based nitride having an appropriate amount of electric charge component, glycerine for providing stability of solution, and a small amount of an acid solution for improving current flow with the dispersed solution. The prepared solution 200 is put in a jig 100 for performing the electrophoretic process as illustrated in FIGS. 2 and 5. A predetermined voltage is applied between a metal mesh 250 and a substrate 300 spaced apart from each other and immersed in the solution 200. Particles dispersed in the solution 200 are deposited on the substrate 300, such as on an electrode of the substrate 300, according to a potential.

Referring to FIG. 1, the substrate 300 in FIGS. 2 and 5 may be the first substrate 10 on which at least the thin film transistor 20 and the pixel electrode 30 are formed. If the substrate 300 is the first substrate 10, the electrode on which particles dispersed in the solution 200 are deposited according to a potential, is the pixel electrode 30.

Referring to FIG. 4, the substrate 300 includes a pixel array area 400 in which a plurality of a pixel or a plurality of a sub-pixel is disposed in a 2D array. The thin film transistor 20 and the pixel electrode 30 (FIG. 1) are disposed in the pixels or sub-pixels. Data pad areas 410 and 430, in which data electrodes are collectively disposed directly thereon, and a gate pad area 450, in which the gate electrodes 21 are collectively disposed directly thereon, are disposed outside of the pixel array area 400.

The data pad areas 410 and 430 may be electrically connected to a data electrode terminal 440, and the gate pad area 450 may be electrically connected to a gate electrode terminal 460. Also, a plurality of a gate terminal 470 disposed to check the thin film transistor 20 may be exposed on the substrate 300 outside of the pixel array area 400. The gate terminals 470 may be extended from the gate electrode 21 or the gate pad area 450, and may be exposed in the solution 200.

Referring again to FIGS. 2 and 5, the substrate 300 is immersed in the solution 200 for forming the electrochromic semiconductor layer 50, in order to deposit the electrochromic semiconductor layer 50 on the pixel electrode 30 when the thin film transistor 20 and the pixel electrode 30 are formed and the pixel electrode 30 is exposed.

In a general line-patterned passive matrix device, when a voltage source is connected to an end of an electrode, a voltage is applied between a metal mesh and the passive matrix device and thus a current flows directly through the electrode. Thus, deposition is accomplished on a substrate through an electrophoretic process.

In contrast, in an active matrix device such as the active matrix electrochromic device according to the present invention, the pixel electrode 30, on which materials are deposited, is separately formed in the island shape and thus a voltage may not be directly applied to the pixel electrode 30. Also, the pixel electrode 30 is connected to a data electrode, but a channel of the thin film transistor 20 is formed in the middle of the pixel electrode 30, thereby acting as a large resistance. Thus, the electrochromic semiconductor layer 50 may not be deposited on the pixel electrode 30 by connection of a voltage source to the data electrode.

Accordingly, in order to form the electrochromic semiconductor layer 50 on the pixel electrode 30 of the active matrix electrochromic device through the electrophoretic process, a voltage source 270 is connected to a terminal electrically connected to the source electrode S, for example, the data electrode or the data electrode terminal 440 connected to the data electrode, and simultaneously, a predetermined voltage is applied to the gate electrode 21 disposed below the pixel electrode 30 so as to open the channel of the thin film transistor 20. Thus, terminals of the source and drain electrodes S and D connected to the data electrode are connected to each other and accordingly, a current flows through the pixel electrode 30 so that the electrochromic semiconductor layer 50 is deposited on the pixel electrode 30.

Referring to FIG. 2, for the electrophoretic process, the substrate 300 is immersed in the solution 200 for forming the electrochromic semiconductor layer 50 in order to soak the pixel electrode 30 in the solution 200. A terminal extended from the gate electrode 21, to which an external voltage source 490 is connected, or a terminal electrically connected to the source electrode S, to which the voltage source 270 is connected, may not be immersed in the solution 200.

If a pad pattern of the substrate 300 is prepared as in FIG. 4, the terminal extended from the gate electrode 21, to which the external voltage source 490 is connected, is the gate electrode terminal 460, and the terminal electrically connected to the source electrode S, to which the voltage source 270 is connected, is the data electrode terminal 440. Hereinafter, for convenience of description, the terminal extended from the gate electrode 21, to which the external voltage source 490 is connected, is the same as the gate electrode terminal 460, and the terminal electrically connected to the source electrode S, to which the voltage source 270 is connected, is the same as the data electrode terminal 440. However, the present invention is not limited thereto.

If the pad pattern of the substrate 300 is prepared as in FIG. 4, the substrate 300 is immersed in the solution so that the data electrode terminal 440 and the gate electrode terminal 460 are not immersed in the solution, as shown in FIGS. 2 and 5.

Accordingly, when the substrate 300 is immersed in the solution 200 to soak the pixel electrode 30 therein, a predetermined voltage is applied to the gate electrode 21 disposed below the pixel electrode 30 and thus a channel of the thin film transistor 20 is opened. Then, while the channel is opened, a voltage is applied between the data electrode terminal 440 of the substrate 300 and the metal meshes 250, and thus the source electrode S and the drain electrode D, are connected to each other due to the open channel. Accordingly, a current flows through the pixel electrode 30 so that the electrochromic semiconductor layer 50 is deposited on the pixel electrode 30.

In order to open the channel of the thin film transistor 20, a predetermined voltage is applied to the gate electrode 21 through, for example, the gate electrode terminal 460, by connecting the external voltage source 490 to the gate electrode 21 and driving the active matrix device as illustrated in FIGS. 2 and 3, or by automatically inducing a voltage generated in the solution 200 to the gate terminal 470, that is, induced voltage leading, and driving the active matrix device as illustrated in FIGS. 5 and 6.

Referring to FIGS. 2 and 3, in order to form the electrochromic semiconductor layer 50 on the pixel electrode 30, the voltage source 270 is connected between the data electrode terminal 440 connected to the data electrode of the substrate 300, and the metal mesh 250. Also, the external voltage source 490 is connected to the gate electrode terminal 460 that is connected to the gate electrode 21, so that a predetermined voltage is applied to the gate electrode 21 of the thin film transistor 20 and thus the channel is opened. Accordingly, the source electrode S and the drain electrode D both connected to the data electrode, are connected to each other due to the channel open and thereby, a current flows through the pixel electrode 30.

Therefore, the electrochromic semiconductor layer 50 is deposited on the pixel electrode 30. According to the methods illustrated in FIGS. 2 and 3, two external voltage sources, that is, the voltage source 270 and the voltage source 490, are needed and control of each of the voltage sources 270 and 490 is required.

As mentioned above, the active matrix device including the thin film transistor 20 may include the gate terminals 470 in an exposed state for checking an error of the thin film transistor 20. The gate terminals 470 are electrically connected to the gate electrode 21. The gate terminals 470 may be disposed to be opened in the solution 200.

Referring to FIGS. 5 and 6, if the substrate 300 is immersed in the solution 200 for forming the electrochromic semiconductor layer 50 by the electrophoretic process until the gate terminals 470 are also immersed in the solution 200, a voltage generated in the solution 200 may be automatically induced to the gate terminals 470, and thus the electrochromic semiconductor layer 50 may be deposited on the pixel electrode 30 without use of a separate external voltage source.

That is, when the substrate 300 is immersed in the solution 200 until the gate terminals 470 are also immersed in the solution 200, as illustrated in FIGS. 5 and 6, when the voltage source 270 is connected between the data electrode terminal 440 connected to the data electrode of the substrate 300, and the metal mesh 250, a voltage is applied between the substrate 300 and the metal mesh 250, and thereby, a voltage generated in the solution 200 may be automatically induced to the gate terminals 470. That is, a fluid induced bias voltage may be generated. Accordingly, as a voltage is induced to the gate terminals 470, a predetermined voltage is applied to the gate electrode 21 of the thin film transistor 20 connected to the gate terminals 470, and the channel of the thin film transistor 20 is opened. Thus, the source electrode S and the drain electrode D both connected to the data electrode are connected to each other due to the opened channel, and thereby, a current flows through the pixel electrode 30.

Therefore, the electrochromic semiconductor layer 50 may be deposited on the pixel electrode 30 by using a self-induced voltage obtained by inducing a voltage generated in the solution 200 to the gate terminals 470, as shown in FIGS. 5 and 6, without connecting a separate external voltage source to the gate electrode 21.

When the self-induced voltage is used, an amount of current applied to the pixel electrode 30 is automatically controlled according to an amount of current flowing through the exposed gate terminals 470, and an excessive current does not flow through the pixel electrode 30 at once. Thus, a current having a predetermined amount or below flows through the thin film transistor 20 and the pixel electrode 30, so that damage to the electrodes or the thin film transistor 20 may be reduced or effectively prevented.

Also, while performing the electrophoretic process, the electrochromic materials may be stacked on the gate terminals 470. As a stacked amount of the electrochromic materials increases, an induced voltage is decreased and finally, the electrochromic materials are no longer stacked. Thus, in the electrophoretic process according to an embodiment of the present invention, the electrochromic semiconductor layer 50 may be stacked until the electrochromic materials are no longer stacked as the induced voltage decreases. Also, stacking of the electrochromic semiconductor layer 50 may be stopped at before the induced voltage decreases below an appropriate value for depositing electrochromic materials.

As mentioned above, when the channel of the thin film transistor 20 is opened by applying a predetermined voltage to the gate electrode 21, for example, through the gate electrode terminal 460, by using the external voltage source 490 (FIGS. 2 and 3), or by applying a voltage to the gate electrode 21 by using a voltage induced in the terminal extended from the gate electrode exposed in the solution 200 from the voltage of the solution 200 (FIGS. 5 and 6), for example, the gate terminals 470, a resistance of the thin film transistor 20 significantly decreases. Accordingly, if, for example, a negative electrode is provided to the data pad areas 410 and 430 to which the data electrodes are connected on the substrate 300, a potential difference occurs between a positive electrode and the patterned pixel electrode 30 in the solution 200, and thus a metal oxide, that is, electrochromic materials, may be deposited on the pixel electrode 30.

As described above, according to the one or more of the above embodiments of the present invention, in the method of manufacturing the active matrix electrochromic device above, the electrochromic semiconductor layer 50 may be selectively deposited on the pixel electrode 30 without breakdown of the active matrix device or the pixel electrode 30, and a deposition process may be accomplished without mixing organic materials. That is, organic materials are removed during the electrophoretic process and inorganic materials are only patterned at low temperature, so that the electrochromic semiconductor layer 50 of the active matrix electrochromic device may be deposited on the pixel electrode 30. Also, the electrochromic semiconductor layer 50 may be selectively deposited on the pixel electrode 30 by the electrophoretic process, so that the active matrix electrochromic device, for example, an active matrix electrochromic display, having high resolution may be manufactured.

In one embodiment, for example, electrochromic characteristics may be obtained without plasticizing at high temperature above 450 Celsius (° C.). Also, a selective deposition may be available in a pixel separator for preventing cross-talk of the electrochromic device, for example, an electrochromic display, so that the active matrix electrochromic device, for example, an active matrix electrochromic display, having high resolution may be manufactured.

It should be understood that the embodiments described therein should be considered in a descriptive sense only and not for purposes of limitation. Descriptions of features within each embodiment should typically be considered as available for other similar features or aspects in other embodiments.

What is claimed is:

1. A method of manufacturing an active matrix electrochromic device, the method comprising:
preparing a first substrate comprising:
a thin film transistor including a gate electrode, a source electrode, and a drain electrode, and
a pixel electrode electrically connected to the drain electrode of the thin film transistor;
immersing the first substrate and a mesh spaced apart from each other in a solution for forming an electrochromic semiconductor layer in an electrophoretic process; and
while the first substrate is immersed in the solution so that the pixel electrode contacts the solution, the forming an electrochromic semiconductor layer includes:
opening a channel of the thin film transistor by applying a voltage to the gate electrode,
generating a potential difference between the pixel electrode and the mesh by connecting a voltage source between a terminal electrically connected to the source electrode, and the mesh, and
depositing materials in the solution on the pixel electrode, and thereby forming the electrochromic semiconductor layer.

2. The method of claim 1, wherein the channel of the thin film transistor is opened by connecting an external voltage source to the gate electrode.

3. The method of claim 2, wherein a terminal extended from the gate electrode, to which the external voltage source is connected, is not immersed in the solution.

4. The method of claim 3, wherein the terminal electrically connected to the source electrode, to which the voltage source is connected, is not immersed in the solution.

5. The method of claim 2, wherein the solution comprises a metal oxide.

6. The method of claim 1, wherein
the first substrate comprises an exposed gate terminal electrically connected to the gate electrode of the thin film transistor,
the immersing the first substrate and a mesh includes immersing the first substrate in the solution so that the exposed gate terminal is immersed in the solution, and
the forming an electrochromic semiconductor layer includes:
generating a voltage in the solution by applying a voltage to the terminal electrically connected to the source electrode and the mesh, and
opening the channel of the thin film transistor by automatically inducing the voltage generated in the solution to be applied the exposed gate terminal.

7. The method of claim 6, wherein the terminal electrically connected to the source electrode, to which the voltage source is connected, is not immersed in the solution.

8. The method of claim 6, wherein the solution comprises a metal oxide.

9. The method of claim 1, wherein the solution comprises a metal oxide.

10. An active matrix electrochromic device formed by the method of claim 1, and comprising: the first substrate comprising: the thin film transistor including the gate electrode, the source electrode, and the drain electrode; the pixel electrode electrically connected to the drain electrode of the thin film transistor; and the electrochromic semiconductor layer on the pixel electrode.

11. The method of claim 1, wherein the opening a channel of the thin film transistor in the forming of the electrochromic semiconductor layer includes applying the voltage to the gate electrode from a second voltage source, different from the voltage source connected between the terminal electrically connected to the source electrode, and the mesh.

12. The method of claim 1, wherein
the opening a channel of the thin film transistor in the forming of the electrochromic semiconductor layer includes applying the voltage to the gate electrode from a voltage generated in the solution, and
the voltage in the solution is generated by applying a first voltage to the terminal electrically connected to the source electrode, and the mesh.

\* \* \* \* \*